United States Patent [19]
Dolby

[11] 3,845,416
[45] Oct. 29, 1974

[54] SIGNAL COMPRESSORS AND EXPANDERS

[75] Inventor: Ray Milton Dolby, London, England

[73] Assignee: Dolby Laboratories Inc., New York, N.Y.

[22] Filed: Sept. 10, 1973

[21] Appl. No.: 396,015

[30] Foreign Application Priority Data

Mar. 12, 1971 Great Britain ...................... 6747/71

[52] U.S. Cl. .................... 333/14, 330/126, 330/151, 333/18, 333/70 CR

[51] Int. Cl. ........ H04b 3/06, H03g 5/16, H03h 7/16

[58] Field of Search ........... 333/1, 6, 14, 18, 17, 28, 333/70 R, 70 CR; 330/124 R, 126, 149, 151; 179/1 P, 1 D, 100.2 K

[56] References Cited

UNITED STATES PATENTS 2,413,263 12/1946 Suter ................................ 333/70 R
2,920,281 1/1960 Appert et al. ........................ 330/124
3,182,271 5/1965 Aiken .................................. 333/18
3,281,723 10/1966 Mercer ................................ 333/18

*Primary Examiner*—James W. Lawrence
*Assistant Examiner*—Marvin Nussbaum
*Attorney, Agent, or Firm*—Dike, Bronstein, Roberts, Cushman & Pfund

[57] ABSTRACT

Compressor and expander circuits are constructed by coupling the outputs of two circuit paths together by a variable coupling means. The inputs of the circuit paths are connected to a common input terminal. The degree of coupling provided by the coupling means varies in dependence upon a signal level in the circuit and the variable coupling means and elements in at least one of the paths interact to narrow the band in which the compressor or expander action takes place as the signal level in this band increases.

21 Claims, 5 Drawing Figures

SIGNAL COMPRESSORS AND EXPANDERS

This is a continuation of application and now abandoned, Ser. No. 232,124, filed on Mar. 6, 1972.

This invention relates to circuits which modify the dynamic range of an input signal —that is to say, signal compressors which compress the dynamic range and signal expanders which expand the dynamic range. Compressors and expanders are sometimes required to work independently of each other; more often, however, the compressor compresses the dynamic range of an input signal before the signal is transmitted or recorded. A complementary expander expands the dynamic range of the received signal or the signal played back from the recording, i.e., the expander restores the linearity of the dynamic range relative to the input signal. Noise introduced during transmission or the record/replay process is substantially reduced and the compressor-expander combination therefore acts as a noise reduction system.

The object of this invention is to provide circuits which can yield compressor and expander characteristics without introducing distortion at high signal levels and yet which can be constructed very simply.

The circuit of the present invention has a first circuit path connected between an input terminal and a first terminal, the first path being linear with respect to dynamic range in its operation. A second circuit path includes an input terminal, a second terminal, and an output terminal. A variable coupling means couples the first and second terminals. The second circuit path further includes a network whose elements are so connected to the second terminal that the frequency response established by the network in conjunction with the variable coupling means is influenced by the parameters of the variable coupling means, the variable coupling means being arranged so to vary in dependence upon one or more signal levels, or differences in levels, in the circuit as to assume such a first extreme value of the coupling between the first and second terminals that the signal level and frequency response at the output terminal are determined substantially by fixed elements when the input signal level is in a first extreme part of the predetermined dynamic range. The variable coupling means assume such an opposite extreme value of the coupling when the input signal level is in the opposite extreme part of the predetermined dynamic range as to tend to narrow the frequency band in which dynamic range modification takes place.

In many practical applications, such as audio, the first path will usually have flat frequency response. At high levels, the variable coupling between the two paths can be arranged essentially to short the output terminal to the output of the first path; the output signal will therefore be the same as the output from the first path. At low levels, the output of the circuit, being the output of the second path, will be dependent on the gain and frequency response of the second path. If the second path output level is higher than that from the first path, then the circuit will function as a compressor; if it is lower than that from the first path the circuit will function as an expander. The frequency response of the second path can be designed to suit the signals and noises to be accommodated. For example, if only hiss is to be treated, then the low-level frequency response (i.e., the decoupled response) will rise at high frequencies in the case of a compressor and fall at high frequencies in the case of an expander.

The variable coupling means may include variable resistances, variable capacitors, and variable inductances.

If the compressors and complementary expanders are to be used in noise reduction systems it is important that signal modulated noise effects should be avoided. This is best achieved by ensuring that the various portions of the spectrum are compressed or expanded as independently of each other as possible. Thus the degree of compression or expansion (i.e., the noise reduction) obtained at the extreme high audio frequencies, for example, should be influenced as little as possible by the signal levels at low and mid frequencies. The present invention provides for this separate treatment by arranging the variable coupling to control the degree of compression and expansion on a frequency selective basis. If a high level signal should appear at a particular frequency, then the variable coupling effectively alters the frequency response of the filter or network in the second path and, at the signal frequency, causes the output signal to tend to be unmodified in dynamic range. However, this is accomplished without so influencing the frequencies far removed from the signal frequency. The frequency band in which compression or expansion takes place is effectively narrowed sufficiently to place the signal frequency outside the band. A high degree of compression and expansion can thereby be maintained at frequencies removed from the high-level signal frequency, with consequent good noise reduction and avoidance of signal modulated noise effects.

In noise reduction systems it is usually sufficient to treat only the low level portion of the dynamic range — e.g., levels less than −20dB, −40dB, or even −60 dB with respect to the nominal maximum operating level (one, two or three orders of magnitude less). Any distortions introduced by the operation of the variable coupling impedance are therefore confined to comparatively low levels, at which they are unobtrusive. At very low levels distortion is avoided because the second path operates with dynamic range linearity in the absence of coupling; at high levels distortion is also avoided, the first path operating with dynamic range linearity and the output being fully coupled to the output of the first path, which operates under all conditions with dynamic range linearity.

In modifications of the invention it is possible for the first path to include a filter which is isolated from the variable coupling means. It is also possible to include a first path impedance or filter which does interact with the variable coupling means.

In some systems it is possible for the coupling to be maximum (minimum impedance) at low levels and minimum (maximum impedance) at high levels. The output characteristics at high levels are therefore those of the second path; at low levels they will be those of both paths coupled together.

Phase shift networks placed in either or both paths are sometimes useful, particularly for optimising the overall response characteristics of the system at various levels.

Both compressors and expanders embodying the invention are separately described herein, but it is also possible to effect a change of mode by the use of a negative feedback amplifier, a compressor or expander being put into the feedback loop to produce expander or compressor action, respectively.

Circuits may be designed for comprising or expanding carrier signals and their sidebands; tuned circuits may be included in the variable coupling means or in either or both paths.

The coupling means can include two or more variable parts, each designed to hand a particular portion of the dynamic range (e.g., low levels and medium levels) or of the frequency spectrum (e.g., high frequencies and low frequencies).

For applications such as video (television), in which nonlinear distortion introduced by the compressor can effectively be compensated by the expander, it is possible to use non-linear elements, such as diodes, to effect the variable coupling action. Non-linear reactances can be similarly employed.

Where non-linear distortion is not permissible, such as in audio, the variable coupling impedance can be controlled in response to a rectified and smoothed signal, whereby a linear or syllabic action is achieved. The control signal can be derived from a number of places in the circuit such as the input or output, but it is usually advantageous to derive the signal from the current through or the voltage across a variable element of the variable coupling impedance — i.e., from parts of the circuit in which the current or voltage is restricted, by the action of the circuit, to a small value of high levels. This approach may require the use of a differential amplifier, but it has the advantage that the control voltage does not build up to excessively large values at high signal levels.

By the use of a two stage integration network it is possible to keep the attack time of the system short while at the same time keeping signal distortion and the generation of modulation products to a minimum. The first stage should have a short time constant. The second stage, having a longer time constant, is coupled to the first stage in a nonlinear fashion, such as by a diode-resistor combination, whereby under uniform signal conditions the second stage is able to provide additional smoothing. However, for large changes in signal amplitude the non-linear network conducts and causes the time constant of the second network to be reduced.

During the attack period overshoots or undershoots may be produced. It is possible to limit these to a low amplitude by the use of appropriately connected non-linear elements such as diodes. Generally, the diodes should be connected to the variable coupling means to prevent the voltage thereacross from exceeding a small value even under extreme transient conditions.

The invention will now be described in more detail, by way of example, with reference to the accompanying drawings, in which.

Figure 1:
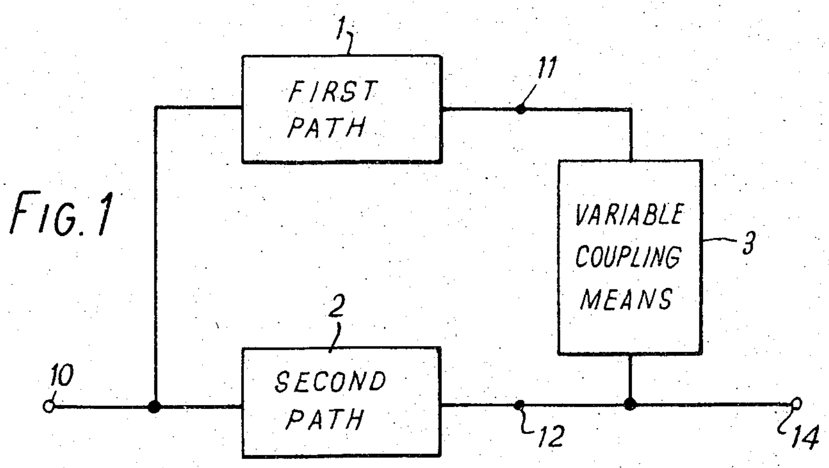
FIG. 1 shows the block diagram of a generalised embodiment of the invention.

Referring to FIG. 1, an input terminal 10 is connected through a first path 1 to a first terminal 11 and through a second path 2 to a second terminal 12 and an output terminal 14, the terminals 12 and 14 being directly connected in this embodiment. The terminals 11 and 12 are coupled together by a variable coupling means 3 which provides a variable degree of coupling between the terminals 11 and 12 in dependence upon one or more signal levels, or differences in levels, in the circuit. Each of the paths 1 and 2 may contain an amplifier. Each path may also contain a filter or electrical network, which in the case of the first path, may or may not be isolated from the terminal 11 by an amplifier. The elements comprised in the network in the second path 2 and in the variable combining means are required to interact directly so as to establish a frequency response of the network which is influenced by the value of the coupling established by the variable coupling means 3.

Figure 2:
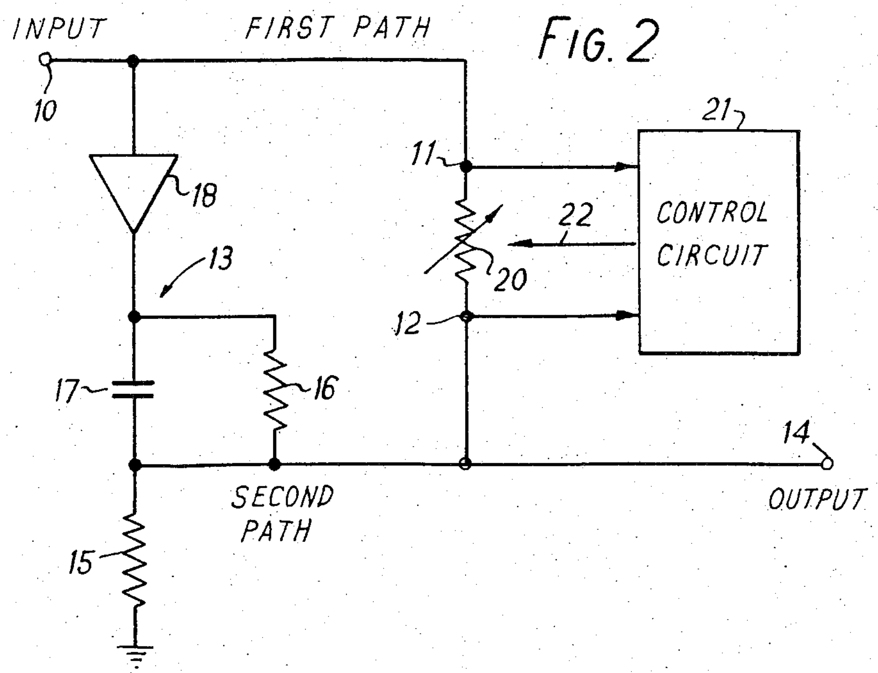
FIGS. 2 and 3 show circuits of a compressor and expander respectively.

Referring now to FIG. 2, the input terminal 10 feeds an input signal directly to the first terminal 11 and to a second terminal 12 through a filter 13. The terminal 12 is connected directly to the output terminal 14. The first path is thus a direct connection while the second path includes the filter 13.

The filter 13 consists of a series arm followed by a shunt resistor 15. The series arm is constituted by a resistor 16 and a capacitor 17 in parallel. Such a filter attenuates the input signal because of the potentiometric action of the resistors 15 and 16 but, superimposed on the attenuation, is a high frequency boost arising by virtue of the capacitor 17. In order to compensate for the attenuation, the filter is preceded by an amplifier 18, which must not follow the filter because the filter must not be isolated from the terminal 12.

Since the attenuation is compensated by the amplifier 18, at frequencies below the pass band of the filter, the signal levels at terminals 11 and 12 are the same.

The terminals 11 and 12 are coupled together by a variable impedance 20, which is a resistor in the embodiment shown. The signal level in the circuit can be sensed at various points in the circuit, but preferably as shown - by sensing the voltage developed across the variable resistor 20 by a control circuit 21 which develops a control signal on a line 22. The circuit 21 can amplify rectify and smooth the said voltage to provide a control signal which varies in dependence upon the mean level of the input signal, which causes the compressor action to be syllabic, rather than instantaneous.

When the control signal increases, the value of the resistance 20 is reduced. This can be achieved in various ways. For example, the resistance 20 can be FET or a photoresistor illuminated by a light bulb which is energised by the control signal.

The action of the circuit is as follows. When the input signal level is low the output signal has a high frequency boost because of the action of the filter 13 and the amplifier 18. There is substantially no contribution to the output signal via the high value resistor 20, which constitutes a variable coupling means providing, under these circumstances, a low value of coupling between the terminals 11 and 12. With high-level, high frequency input signals the high frequency boost is eliminated in that the resistor 20, now with a very low impedance (i.e., a high coupling value) shifts the turnover frequency of the filter 13 to such a high value that there is no significant boost within the frequency range of interest, and signal reaching the output terminal 14 is substantially only the signal conducted by the resistor 20. At intermediate levels there is a smooth transition between the two conditions noted above.

By suitable selection of amplifier gain and component values it can be arranged that the overall response of the circuit is linear as to dynamic range at frequencies below the turnover frequency possessed by the filter when the resistor 20 has a high value. At high frequencies, however, the signals receive a boost at low signal levels only which compresses the dynamic range of the signal. Therefore the circuit operates as a signal compressor at high frequencies only.

For example, in an audio application, the turnover frequency at low signal levels can be placed at around 3KHz and the boost can be 10dB (at −40dB or less). Such a compressor used in conjunction with a complementary expander can then provide a high frequency noise reduction of 10dB.

Figure 3:
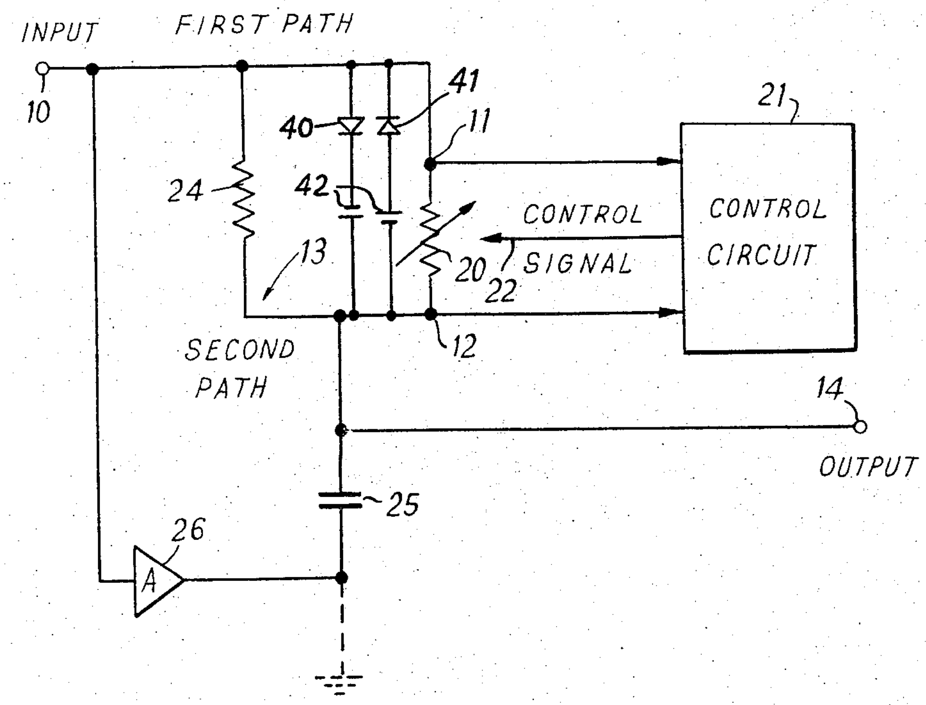

An expander can take the form shown in FIG. 3 in which the filter 13 now comprises a series resistor 24 and a shunt capacitor 25 connected to earth; this filter attenuates the output of the second path to the terminal 12 at high frequencies and low input signal levels. At higher levels at high frequencies, the value of the resistor 20 is progressively reduced, raising the turnover (cut-off) frequency of the filter and narrowing the frequency band in which expansion takes place.

The bottom end of capacitor 25 can alternatively be connected to the output of a low output impedance amplifier 26 driven from the input, thus providing an active second path. If the amplifier has a gain A less than unity, any desired shelf in the frequency response of the expansion characteristics can be produced — e.g., a 10dB attenuation above a certain frequency ($A = 0.316$). If the gain is greater than unity a compression characteristic is produced (e.g. for $A = 3.16$, a 10dB high frequency boost is produced).

FIG. 3 also shows an example of the use of non-linear overshoot or undershoot suppression means in the form of diodes 40 and 41, together with the threshold setting bias means 42; the same principle is applicable to compressors.

The diode circuit further illustrates non-linear coupling (i.e., without control circuit 21 and resistor 20), whether in compressors or expanders.

Figure 4:
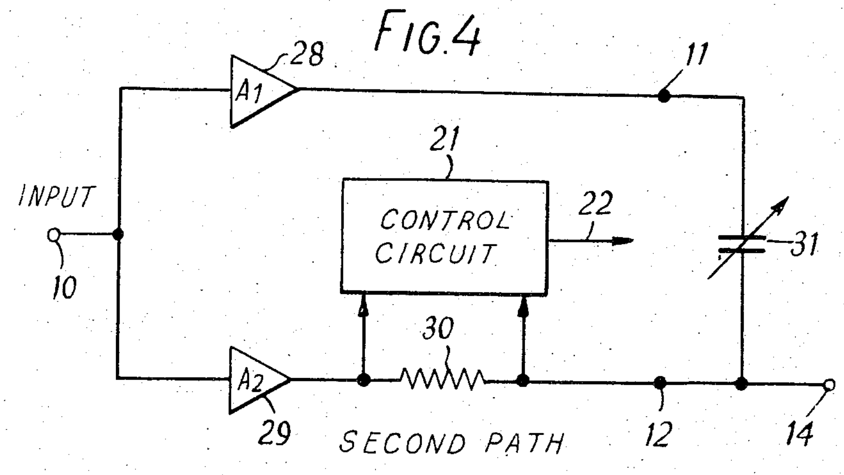
FIG. 4 shows the circuit of an embodiment of the invention in which the coupling is maximum at low levels and minimum at high levels.

FIG. 4 shows an example of a circuit in which the coupling is maximum at low levels and minimum at high levels. The circuit uses a variable capacitance coupling means, but it could similarly use variable inductors or resistors.

The first path includes an amplifier 28 while the second path comprises an amplifier 29 followed by a series resistor 30. The control circuit senses the voltage across this resistor and controls the value of a variable capacitor 31 constituting the variable coupling means coupling the terminals 11 and 12.

At low levels the value capacitor 31 is greatest, and the circuit will exhibit a rising or falling response characteristic with a shelf determined by the relative gains $A_1$ and $A_2$ of the two amplifiers. If $A_1$ is greater than $A_2$, the circuit will operate as a compressor, and vice versa. If the input level rises the value of the capacitor decreases, raising the turnover frequency and narrowing the band in which compression or expansion takes place. The control circuit 21 effectively senses the current through the variable capacitance; maximum control voltage is developed when high level, high frequency components are present.

Figure 5:
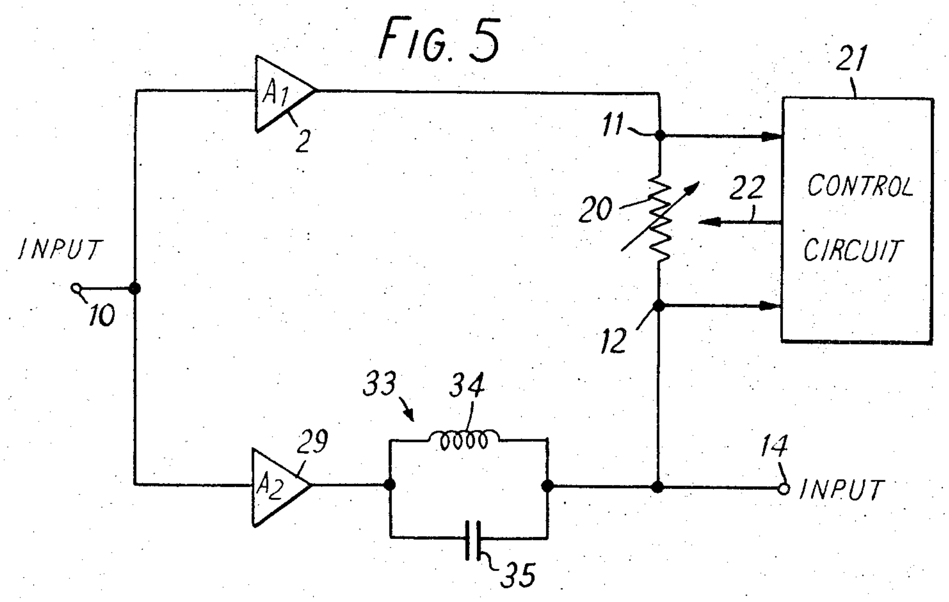
FIG. 5 shows the circuit of an embodiment for use with carrier signals and their sidebands.

FIG. 5 shows an example of a processor for use with carrier signals and their sidebands.

The first path here includes an amplifier 28 and the second path includes an amplifier 29 followed by a filter or tank circuit 33 consisting of an inductor 34 and capacitor 35 in parallel. The terminals 11 and 12 are coupled by a resistor 20 as in FIGS. 2 and 3.

Under low level sideband conditions the value of the resistor 20 is high. The control circuit and the resistor serve to keep the level of carrier and sidebands low across the resistor. The signal appearing at the output will therefore have the carrier level appropriate to path 1, but, at low sideband levels, the sidebands appropriate to path 2. Thus, if gain $A_2$ is greater than $A_1$ then at low levels the sidebands will be transmitted through the tank circuit 33 to the output, which will then be boosted, so that the circuit serves as a compressor. If gain $A_1$ is larger than $A_2$ then the sideband output at low levels will be lower, comparatively, than at high levels and the circuit therefore serves as an expander. At low sideband levels the resistor 20 has a high value compared with the impedance of the tank at the sideband frequencies and therefore wide bandwidths of sidebands, on both sides of the carrier frequency, are coupled by the tank circuit. If the sideband level across the resistor 20 increases, then the value of the resistor 20 is reduced in value and the effective sideband bandwidth is narrowed in which the tank couples effectively and in which compression and expansion takes place.

What is claimed is:

1. A circuit for modifying, within a predetermined input dynamic range, the dynamic range of an input signal comprising an input terminal and a first terminal, a first circuit path connected between the input terminal and the first terminal, the first path passing said input signal to said first terminal with dynamic range linearity, a second circuit path connected to said input terminal and having a second terminal, and an output terminal, a variable coupling means including at least one variable impedance providing a variable degree of coupling between the first and second terminals, the second circuit path including at least one impedance element which is connected to the second terminal, the frequency response of the said circuit being determined at least in part by the interacting combination of said impedance element and said variable impedance and varying as the degree of coupling between the first and second terminals provided by the variable coupling means varies, the variable coupling means being arranged so to vary in dependence upon the level of a signal existing in the circuit as to assume such a first extreme value of the coupling between the first and second terminals that the signal level and frequency response at the output terminal are determined substantially by fixed elements when the input signal level is in a first extreme part of the predetermined dynamic range and to assume such an opposite extreme value of the coupling when the input signal level is in the opposite extreme part of the predetermined dynamic range, the sense of said coupling being to narrow the frequency band in which dynamic range modification takes place when the input signal level increases.

2. A circuit according to claim 1, wherein the first extreme part is a low part, the opposite extreme part is a high part, the first extreme value is a high value, and the opposite extreme value is a low value.

3. A circuit according to claim 1, wherein the first extreme part is a low part, the opposite extreme part is a high part, the first extreme value is a low value, and the opposite extreme value is a high value.

4. A circuit according to claim 1, wherein the output signal has dynamic range linearity relative to the signal at the second terminal.

5. A circuit according to claim 1, wherein the first circuit path includes a filter.

6. A circuit according to claim 1, wherein the circuit path gains are so proportioned that, in at least part of the frequency band, the circuit provides a boosted signal at the output when the input signal level is in the low part of the predetermined dynamic range, whereby the circuit acts as a compressor.

7. A circuit according to claim 1, wherein the circuit path gains are so proportioned that, in at least part of the frequency band, the circuit provides an attenuated signal at the output when the input signal level is in the low part of the predetermined dynamic range, whereby the circuit acts as an expander.

8. A circuit according to claim 1, wherein the said network comprises a tuned circuit for dealing with a carrier frequency.

9. A circuit according to claim 1, wherein the variable coupling means is constituted by a variable impedance.

10. A circuit according to claim 9, wherein the variable impedance comprises a variable resistance.

11. A circuit according to claim 9, wherein the variable impedance comprises a variable reactance.

12. A circuit according to claim 1, wherein said signal existing in the circuit is a signal which exists at said variable coupling means and which is limited at high input signal levels when the circuit operates to narrow the said frequency band.

13. A circuit according to claim 1, wherein the circuit path gains are such that, at low input signal levels and outside the said frequency band the signal levels at said first and second terminals are substantially the same.

14. A noise reduction system wherein a compressor compresses the dynamic range of an input signal before the signal is transmitted or recorded and wherein a complementary expander expands the dynamic range of an input signal thereto which is the received signal or the signal played back from the recording to restore the linearity of the dynamic range relative to the input signal, characterized in that:

A. the compressor comprises an input terminal and a first terminal, a first circuit path connected between the input terminal and the first terminal, the first circuit path passing said input signal to the compressor with dynamic range linearity, a second circuit path connected to said input terminal and having a second terminal, and an output terminal, a variable coupling means including at least one variable impedance providing a variable degree of coupling between the first and second terminals, the second circuit path including at least one impedance element which is connected to the second terminal, the frequency response of the compressor being determined at least in part by the interacting combination of said impedance element and said variable impedance and varying as the degree of coupling between the first and second terminals provided by the varible coupling means varies, the variable coupling means being arranged so to vary in dependance upon the level of a signal existing in the compressor as to assume such a first extreme value of the coupling between the first and second terminals that the signal level and frequency response at the output terminal are determined substantially by fixed elements when the input signal level is in a first extreme part of its dynamic range and to assume such an opposite extreme value of the coupling when the input signal level is in the opposite extreme part of its dynamic range, the sense of said coupling being to narrow the frequency range in which compression takes place when the input signal level increases, and the circuit path gains being so proportioned that, in at least a part of the frequency band, the compressor provides a boosted signal at the output when the input signal level is in the low part of its dynamic range, B. the expander comprises an expander input terminal and an expander first terminal, an expander first circuit path connected between the expander input terminal and the expander first terminal, the expander first circuit path passing said input signal to the expander with dynamic range linearity, an expander second circuit path connected to said expander input terminal and having an expander second terminal, and an expander output terminal, an expander variable coupling means including at least one expander variable impedance providing a variable degree of coupling between the expander first and second terminals, the expander second circuit path including at least one expander impedance element which is connected to the expander second terminal, the frequency response of the expander being determined at least in part by the interacting combination of said expander impedance element and said expander variable impedance and varying as the degree of coupling between the expander first and second terminals provided by the expander variable coupling means varies, the expander variable coupling means being arranged so to vary in dependence upon the level of a signal existing in the expander as to assume such a first extreme value of the coupling between the expander first and second terminals that the signal level and frequency response at the expander output terminal are determined substantially by fixed elements when the expander input signal level is in a first extreme part of its dynamic range and to assume such an opposite extreme value of the coupling when the expander input signal level is in the opposite extreme part of its dynamic range, the sense of said coupling being to narrow the frequency range in which expansion takes place when the expander input signal level increases, and the expander circuit path gains being so proportioned that, in at least a part of the frequency band, the expander provides an attenuated signal at the expander output when the expander input signal level is in the low part of its dynamic range.

15. A circuit for modifying, within a predetermined input dynamic range, the dynamic range of an input signal, comprising a first terminal, a first circuit means for providing a signal at said first terminal in response to said input signal, the first circuit means providing at said first terminal a signal which has dynamic range linearity relative to said input signal, a second circuit means which is responsive to said input signal and having a second terminal, and an output terminal, variable coupling means including at least one variable impedance providing a variable detree of coupling between the first and second terminals, the second circuit means including at least one impedance element which is coupled to the second terminal, the frequency response of the said circuit being determined at least in part by the interacting combination of said impedance element and said variable impedance and varying as the degree of coupling between the first and second terminals provided by the variable coupling means varies, the variable coupling means being arranged so as to vary in dependence upon the level of a signal existing in the circuit as to assume such a first extreme value of the coupling between the first and second terminals that the signal level and frequency response at the output terminal are determined substantially by fixed elements when the input signal level is in a first extreme part of the predetermined dynamic range and to assume an opposite extreme value of the coupling when the input signal level is in the opposite extreme part of the predetermined dynamic range, the sense of said coupling being to narrow the frequency band in which dynamic range modification takes place when the input signal level increases.

16. A circuit for modifying the dynamic range of an input signal, comprising a first terminal, a second terminal, a first circuit means for providing a first signal at said first terminal in response to said input signal, said first signal having dynamic range linearity relative to said input signal, a second circuit means including impedance means and which is responsive to said input signal to provide a second signal which is coupled through said impedance means to said second terminal, means for deriving an output signal from said second terminal, and variable coupling means including at least one variable impedance providing a variable degree of coupling between the first and second terminals, the frequency response of the said circuit being determined at least in part by the interacting combination of said impedance means and said variable coupling means, the variable coupling means being arranged to vary in dependence upon the level of a signal existing in the circuit, the sense of variation of said degree of coupling being such as to narrow the frequency band in which dynamic range modification takes place when the input signal level increases.

17. A circuit according to claim 16 wherein the variable coupling means assume such a first extreme value of the coupling between the first and second terminals when the input signal is at one extreme of a predetermined input dynamic range that the signal level and frequency response at the second terminal are then determined substantially by fixed elements, and wherein the variable coupling means assume a second extreme value of said coupling when the input signal is at the other extreme of said predetermined dynamic range.

18. A circuit according to claim 16 wherein said narrowing of the frequency band in which dynamic range modification takes place excludes from said dynamic range modification input signals whose level exceeds a low level threshold, said threshold being about one order of magnitude less, or even smaller, than the nominal maximum operating level.

19. A circuit according to claim 16 comprising a control circuit responsive to said signal existing in the circuit to effect the variation of said variable coupling means, said control circuit including rectifying and smoothing means operative to provide syllabic action.

20. A method of modifying the dynamic range of an input signal, wherein a first signal is provided at a first terminal from said input signal, a second signal is provided at a second terminal from said input signal through an impedance, an output signal is derived from said second terminal, and a variable coupling is established between said first and second terminals for varying the proportions in which said first and second signals contribute to said output signal, and for establishing a variable frequency response determined at least in part by the interaction of said impedance and said variable coupling, and varying said coupling so that a frequency band, within which dynamic range modification takes place and which is determined by said variable frequency response, is narrowed as the level of said input signal increases.

21. A method according to claim 20 wherein said coupling is varied in dependence upon the signal existing between said first and second terminals.

* * * * *